(12) United States Patent
Krasemann

(10) Patent No.: US 7,390,713 B2
(45) Date of Patent: Jun. 24, 2008

(54) METHOD FOR FORMING TRENCH MEMORY CELL STRUCTURES FOR DRAMS

(75) Inventor: Anke Krasemann, Dresden (DE)

(73) Assignee: Infineon Technologies AG, Munich (DE)

( * ) Notice: Subject to any disclaimer, the term of this patent is extended or adjusted under 35 U.S.C. 154(b) by 403 days.

(21) Appl. No.: 11/152,326

(22) Filed: Jun. 14, 2005

(65) Prior Publication Data

US 2006/0003524 A1 Jan. 5, 2006

(30) Foreign Application Priority Data

Jun. 15, 2004 (DE) ........................ 10 2004 028 852

(51) Int. Cl.
*H01L 21/8242* (2006.01)
(52) U.S. Cl. .................. 438/243; 438/246; 438/389
(58) Field of Classification Search ......... 438/243–247, 438/386–392
See application file for complete search history.

(56) References Cited

U.S. PATENT DOCUMENTS 6,025,224 A * 2/2000 Gall et al. ................... 438/243

6,972,220 B2 * 12/2005 Bertin et al. ................. 438/152

FOREIGN PATENT DOCUMENTS

| DE | 102 58 761 | 1/2004 |
| DE | 102 40 429 | 3/2004 |

* cited by examiner

*Primary Examiner*—Tuan H Nguyen
(74) *Attorney, Agent, or Firm*—Dicke, Billig & Czaja, PLLC

(57) ABSTRACT

One embodiment of the invention relates to a method for forming trench memory cell structures having trench capacitors and planar selection transistors. An implantation for forming a reinforcement implant for improving the electrical connection of a storage electrode of a trench capacitor to a first source/drain zone of the respective selection transistor is effected in a self-aligned manner with respect to gate stacks provided above a substrate surface of the semiconductor substrate. In order to form the reinforcement implant, the deposition process for a first insulator layer, from which dielectric spacer structures of the gate stacks emerge, is divided into at least two substeps, the implantation being preceded by application of a base layer of the first insulator layer, the layer thickness of which defines the distance between the reinforcement implant and the gate stacks. A covering layer of the first insulator layer that is provided after the implantation improves the dielectric properties of the spacer structures which insulate the gate stacks from bit contact structures to be provided between the gate stacks.

20 Claims, 4 Drawing Sheets

METHOD FOR FORMING TRENCH MEMORY CELL STRUCTURES FOR DRAMS

CROSS-REFERENCE TO RELATED APPLICATIONS

This Utility Patent Application claims priority to German Patent Application No. DE 10 2004 028 852.6, filed on Jun. 15, 2004, which is incorporated herein by reference.

BACKGROUND

One embodiment of the invention relates to a method for forming trench memory cell structures each having a trench capacitor and a selection transistor for selectively addressing the trench capacitor.

Memory cells of dynamic random access memories (DRAMs) include a storage capacitor for storing an electrical charge characterizing an information content of the memory cell, and also a selection transistor for addressing the storage capacitor.

In trench memory cells, the storage capacitors are formed as trench capacitors along hole trenches which are introduced into a semiconductor substrate from a substrate surface. The selection transistors are provided as field effect transistors each having an active zone formed in the semiconductor substrate and a gate electrode bearing on the semiconductor substrate.

The active zone comprises two source/drain zones which are spaced apart from one another by a channel zone and are in each case formed as doped sections of the semiconductor substrate.

A first source/drain zone in a node section of the active zone is connected to a storage electrode of the trench capacitor that is provided in the interior of the hole trench. A second source/drain zone in a bit contact section of the active zone is connected to a bit contact structure via which the trench memory cell is connected to a data line.

In a manner dependent on a potential at the gate electrode, when the memory cell is addressed, a conductive channel is produced between the two source/drain zones of the selection transistor and the storage electrode is connected to the data line. In the non-addressed state of the memory cell, the storage electrode is insulated from the data line.

The storage electrode adjoins the first source/drain zone in an electrically conductive manner in the semiconductor substrate in the region of a contact window (buried strap window).

The alignment of the source/drain zones with respect to the gate electrodes is essential to the functionality of the selection transistor.

A method of aligning the source/drain zones or sections of the source/drain zones precisely with respect to the gate electrodes is described in DE 102 40 429 A1 (Popp et al.).

Accordingly, gate electrode stacks (also called gate stacks hereinafter) with a base layer made of polysilicon are formed above a semiconductor substrate with trench capacitors on a gate dielectric. An implantation for forming at least one section of the doped source/drain zones is effected in a self-aligned manner with respect to the edges of the gate stacks. The implantation of the doping is performed before or after the conclusion of a sidewall oxidation of the polysilicon layer. The formation of the sidewall oxide is combined with the implantation and the extent of the doped zones below the gate stacks is thereby controlled by means of the sidewall oxidation.

In order to form a reliable, low-resistance connection between the storage electrode of the trench capacitor and the first source/drain zone of the selection transistor, an implantation is necessary whose outdiffusion under the adjacent gate stacks is to be kept low, so that the sidewall oxide is not sufficient for spacing apart the reinforcement implant with respect to the gate stacks.

SUMMARY

One embodiment of the invention is a method of forming a trench memory cell structure having a trench capacitor and a selection transistor. The trench capacitor is formed having a storage electrode formed as filling of a hole trench in a substrate. A gate conductor layer is patterned on a gate dielectric on the substrate to form gate stacks. The gate stacks form gate electrodes of the selection transistors in sections. A node section is formed on one side of a gate electrode and a bit contact section of an active zone is formed on the opposite side. A base layer of a first insulator layer is conformally applied. Doped reinforcement zones are formed at least in the node sections of the substrate and a covering layer of the first insulator layer is conformally applied.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
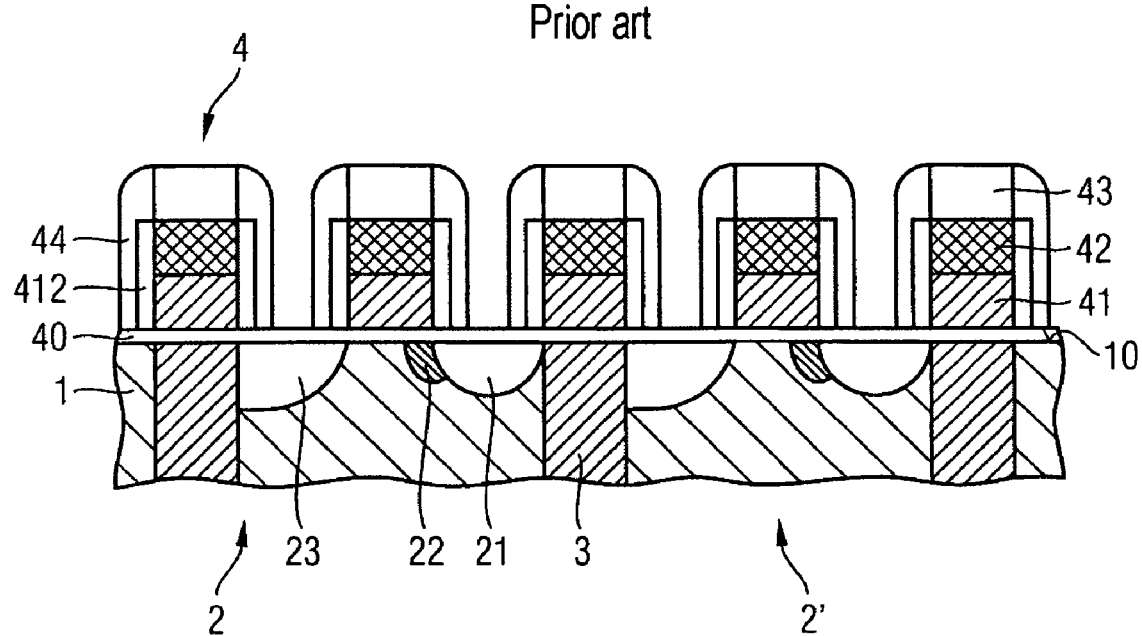
FIGS. 1A and 1B illustrate schematic cross-sections concerning a conventional method for forming trench memory cell structures.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a method for forming a trench memory cell structure, which enables a reinforcement implant for improving the quality of an electrical connection between the storage electrode of a trench capacitor and a first source/drain zone of the selection transistor for gate electrode widths of less than 90 nanometers.

According to one embodiment of the invention, an insulator layer is used for alignment of the reinforcement implant, spacer structures emerging from said insulator layer in the further course of the processing. The spacer structures in each case extend along the vertical sidewalls of the gate stacks and insulate conductive sections of the gate stacks from bit contact structures that are to be provided between the gate stacks. The thickness of the spacer structures results from the capacitive decoupling of the gate stacks from the bit contact structures introduced between the gate stacks, and also from the maximum permissible leakage current and the reliability of the electrical insulation between the gate stacks and the bit contact structures.

In one case, the reinforcement implant is necessary only in a node section of an active zone—formed in the semiconductor substrate—of the respective selection transistor on that side of the gate stack which faces the respectively assigned trench capacitor. Prior to its implantation, therefore, a temporary mask is conventionally required which covers the bit contact section opposite to the node section at the relevant gate stack during the implantation of the reinforcement implant.

In one embodiment of the present invention, the conformal deposition of the first insulator layer is divided between two or more substeps, the implantation for forming the reinforcement implant is effected between the substeps and, furthermore, the process parameters of the reinforcement implant are chosen such that the implantation can be effected in unmasked fashion at least in the cell array.

In detail, the method according to one embodiment of the invention for forming trench memory cell structures each having a trench capacitor and a selection transistor for selectively addressing the trench capacitor includes firstly the formation of trench capacitors in a semiconductor substrate, storage electrodes of the trench capacitors in each case being formed as filling of a hole trench introduced into the semiconductor substrate from a substrate surface of the semiconductor substrate. A gate conductor layer stack is deposited and patterned on a gate dielectric provided on the semiconductor substrate. In this case, gate stacks emerge from the gate conductor layer stack, which gate stacks in each case form in sections the gate electrodes of selection transistors and also word line structures for addressing the memory cells.

On both sides of each gate electrode, a node section and a bit contact section of an active zone of the respective selection transistor are in each case defined in the semiconductor substrate. Above the node and bit contact sections, the gate conductor layer stack is caused to recede, so that a gate dielectric, the semiconductor substrate or a sacrificial oxide is uncovered in said sections.

A conformal base layer of a first insulator layer is applied. The base layer covers a relief formed by the gate stacks in uniform thickness. The layer thickness of the base layer is determined such that, in a subsequent implantation step, the doped reinforcement zones or reinforcement implants are formed in the node sections of the semiconductor substrate in a suitable manner aligned with respect to the edges of the gate stacks. After the implantation, a conformal covering layer of the first insulator layer is provided and the first insulator layer is reinforced to a required minimum layer thickness.

By splitting the deposition of the first insulator layer into at least two substeps, the parameters and in particular the alignment of the reinforcement implant with respect to the gate stacks are decoupled from the final layer thickness of the first insulator layer. By means of the selectable thickness ratio of the covering layer with respect to the base layer, a further free parameter for alignment of the reinforcement implant is obtained. A mask for covering the bit contact sections is unnecessary.

In one embodiment, the bit contact sections are covered after the application of the covering layer and a second conformal insulator layer is subsequently applied. The interspaces between the gate stacks above the node sections are filled in this case. If the method according to the invention is incorporated into such processing, then the need to subsequently open the closed interspaces above the node sections for a reinforcement implant in a complicated manner is obviated.

In accordance with one embodiment, the bit contact sections are covered by application of a sacrificial structure, the upper edge of which is provided above the upper edge of the gate stacks. If the second insulator layer is subsequently caused to recede anisotropically for instance in the front end of removal of the sacrificial structure, then this results in the use of the insulator layer as a spacer insulator for bit contact structures subsequently provided instead of the sacrificial structures.

The sacrificial structures are in one case removed after the formation of the spacer structures. The first insulator layer is opened above the bit contact sections by means of a spacer etching.

After spacer etching, conductive material is applied and bit contact structures adjoining the bit contact sections are formed in each case.

In accordance with another embodiment, the gate conductor layer stack is provided with a first layer made of polysilicon and a sidewall oxide is produced on the sidewalls of the base layer prior to the application of the base layer.

The distance between the reinforcement implant and the adjacent gate stacks is set by means of the thickness of the base layer.

The reinforcement implant improves the electrical properties of the connection between the storage electrode and the first source/drain zone in the node section of the active zone of the selection transistor assigned to the storage electrode.

In one embodiment, the base layer and the covering layer are provided with the same layer thickness.

In one embodiment, the base layer and the covering layer are provided by means of the same method and from the same material, so that the process complexity is only slightly increased.

The two drawings of FIG. 1 in each case illustrate a schematic cross section of a detail from a cell array with memory cells having planar selection transistors and trench capacitors for customary layouts.

The cell array layout of FIG. 1A relates to a checkerboard layout, in which the memory cells adjoin one another in each case in the same orientation.

Trench capacitors 3 are formed in a semiconductor substrate 1. The trench capacitors 3 are in each case formed along hole trenches which are introduced into the semiconductor substrate 1 from a substrate surface 10 of the semiconductor substrate 1. In the interior of the hole trenches, a storage electrode is in each case provided as filling of the hole trench. The counterelectrode is in each case formed as a doped zone enveloping the respective hole trench in the semiconductor substrate 1 outside the region illustrated.

An active zone of a selection transistor 2, 2' is provided in the semiconductor substrate 1 between two trench capacitors 3 in each case. The active zone comprises two source/drain zones 23, 21, a first source/drain zone 23, in a node section 101 of the active zone, electrically conductively adjoining the storage electrode of the trench capacitor 3. The two source/drain zones 21, 23, which are formed in each case as doped zones of the n conductivity type, are separated from one another by a nondoped or oppositely doped channel zone. The charge carrier distribution in the channel zone is controlled by a potential at a gate electrode assigned to the selection transistor 2, 2', which gate electrode is arranged as a section of a gate stack 4 above the channel zone and is spaced apart from the latter by a gate dielectric 40. An asymmetrical doping zone 22 supplements the second source/drain zone 21, which is formed in a bit contact section 102 of the active zone, in order to improve the transistor properties.

The gate stack 4 comprises a polysilicon layer 41 bearing on the gate dielectric 40, a highly conductive layer 42 made of a metal or a metal compound, a cap layer 43 made of a dielectric material, and further barrier layers (not illustrated). In the region of the polysilicon layer 41 and of the highly conductive layer 42, the vertical sidewalls of the gate stacks 4 are oxidized and sidewall oxides 412 are formed. The insulation on the vertical sidewalls of the gate stacks 4 is supplemented by sidewall spacers 44.

The gate stacks 4 are equidistant word line structures running perpendicular to the cross-sectional plane. The illustration of insulator structures that electrically insulate the individual memory cells from one another has been dispensed with for the sake of better clarity in the illustration.

Figure 1B:
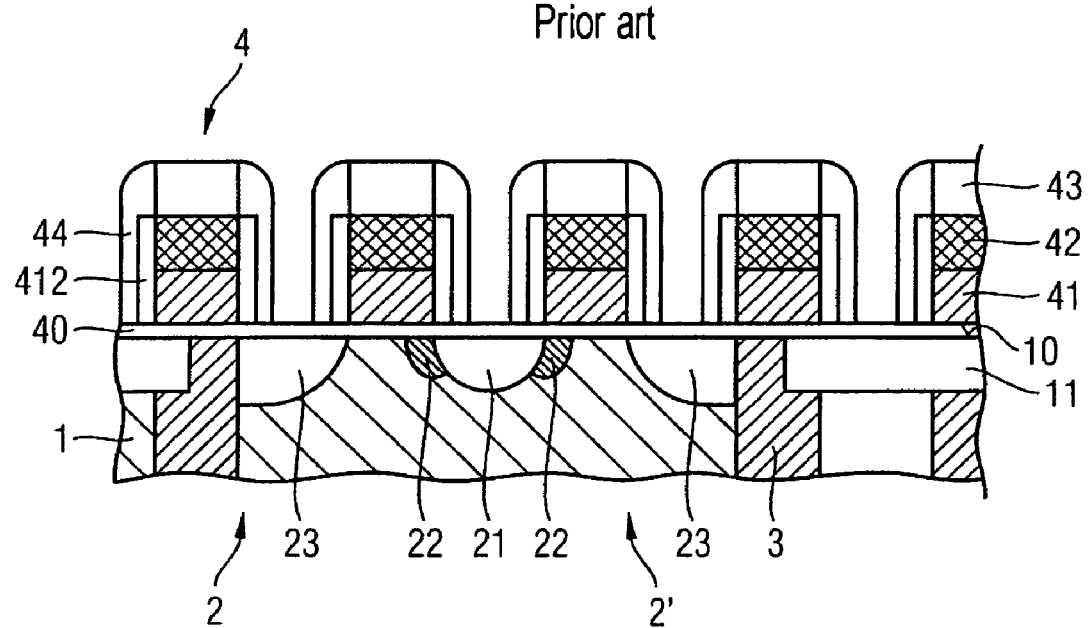

FIG. 1B illustrates a section of a cell array in the MINT layout. In this case, two memory cells arranged next to one another are in each case arranged in pairs and mirror-symmetrically with respect to one another, so that both memory cells are led to a common bit contact structure. Accordingly, the second source/drain zone 21 illustrated is assigned both to the selection transistor 2 adjoining on the left and to the selection transistor 2' adjoining on the right. The memory cell pairs are insulated from adjacent memory cell pairs by shallow insulator structures (shallow trench isolation, STI) 11.

The formation of the source/drain zones 21, 22, 23 takes place after the formation of the gate stacks 4 and in a manner aligned with respect to the edges thereof.

Figure 2A:
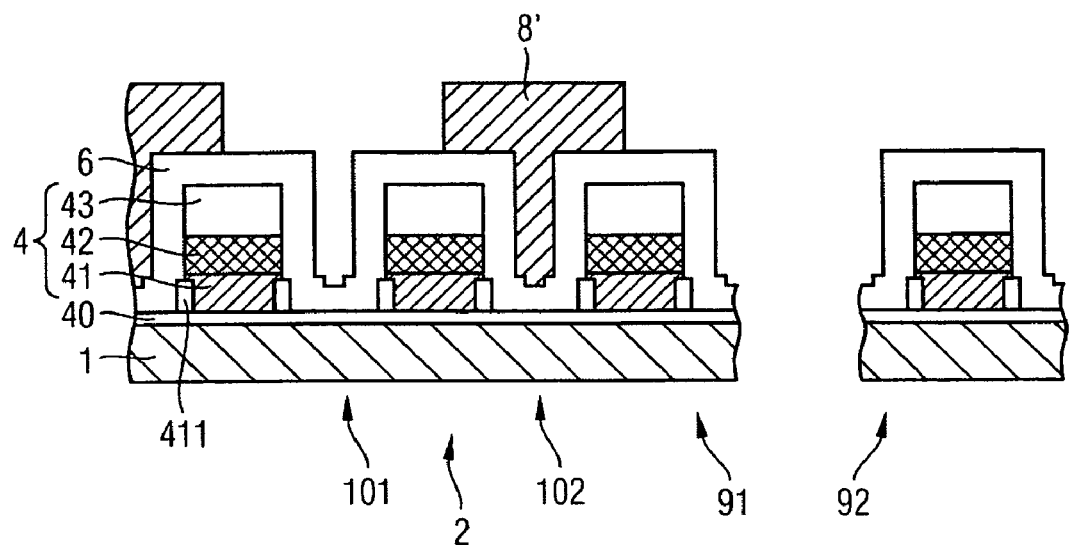
FIGS. 2A and 2B illustrate schematic cross-sections for elucidating the method according to one embodiment of the invention.
Figure 2B:
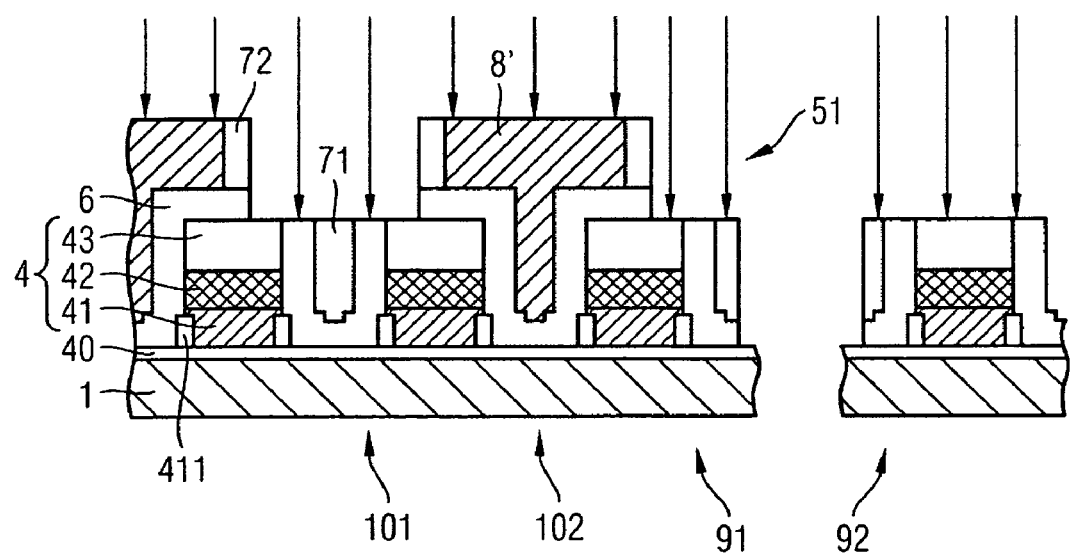

If the sidewall oxide 412 does not suffice for the alignment of a reinforcement implant 24 with respect to the gate stacks 4 on account of an excessively small final layer thickness, then the disadvantages illustrated with reference to FIG. 2A and FIG. 2B result given rectilinear continuation of the prior art.

The following discussion is independent of the layout of the memory cells (MINT layout, checkerboard layout), for which reason the illustration of the trench capacitors is dispensed with in the following figures for the sake of simplification.

A dielectric layer bears on a substrate surface 10 of a semiconductor substrate 1, and forms a gate dielectric 40 in sections below gate stacks 4. A polysilicon layer 41 of the gate stacks 4 in each case bears on the gate dielectric 40. A highly conductive layer 42 including one or more layers made of a metal or a metal compound bears on the polysilicon layer 41. A dielectric cap layer 43 bears on the highly conductive layer 42. The vertical sidewalls of the polysilicon layer 41 are oxidized and covered by sidewall oxides 411.

The section illustrated comprises a section of a cell array 91 and also a section of a support region 92, the memory cells being provided in the cell array 91 and support circuits for addressing the memory cells and also for signal evaluation and conditioning being provided in the support region 92.

If the cell array 91 is then processed in accordance with a manner suitable for forming the support region 92, then a conformal insulator layer 6 is applied to the relief formed by the gate stacks 4 bearing on the semiconductor substrate 1. The material of the insulator layer 6 is LPCVD silicon oxide. The layer thickness of the insulator layer 6 is approximately 32 nanometers if the gate stacks 4 have a pitch of 140 nanometers. The minimum layer thickness of the first insulator layer 6 results from the requirements for the dielectric decoupling of the word line structures realized by means of the gate stacks 4 from the bit contact structures 8 to be provided between the word line structures.

Independently of the layout chosen for the memory cells, in the semiconductor substrate 1 a node section 101 is arranged in each case on one side of a gate stack 4 and a bit contact section 102 is arranged opposite to said node section.

Subsequently, the need to deposit a silicon nitride layer having a thickness of at least 15 nanometers as second insulator layer arises from the continuation of the processing in the support region 92.

By being caused to recede anisotropically, the second insulator layer gives rise to spacer insulators 72 on the vertical sidewalls of sacrificial structures 8' and also closure structures 71, which close the interspace between the gate stacks 4 above the node sections 101.

Consequently, the node sections 101 of the semiconductor substrate 1 are no longer accessible to an implantation 51 without further additional processing. The reinforcement implant can no longer be introduced into the node sections 101 provided therefor in the semiconductor substrate 1.

The implantation for forming the reinforcement implant is not possible in the required manner on account of the required minimum layer thickness of the final insulator layer 6 even before the application of the second insulator layer. The distance between the implantation and the gate stacks 4 is then prescribed by the final layer thickness of the first insulator layer 6 and is too large at feature sizes of less than 70 nanometers.

The method according to one embodiment of the invention for forming a trench memory cell structure is described on the basis of an exemplary embodiment of the method according to one embodiment of the invention with reference to FIG. 3. Since the method is independent of the cell layout, the illustration of the trench capacitors and also the illustration of insulator structures that insulate the trench memory cells from one another are dispensed with. The figures in each case relate to a detail from a cell array 91 and a detail through a support region 92.

Trench capacitors 3 are formed in a semiconductor substrate 1, the storage electrodes of which trench capacitors are to be connected to selection transistors formed in planar fashion with respect to the substrate surface 10.

Above the substrate surface 10, a gate conductor layer stack is deposited onto a gate dielectric 40. The gate conductor layer stack is patterned photo-lithographically, gate stacks 4 emerging from the gate conductor layer stack. The gate stacks 4 form mutually parallel, periodic, striplike word line structures which are separated from one another by interspaces. Below the interspaces, in the semiconductor substrate 1, a node section 101 is defined in each case on one side of a gate stack 4 and a bit contact section 102 is defined on that side of the gate stack 4 which is opposite to the node section 101.

The gate conductor layer stack includes an underlying polysilicon layer 41, a highly conductive layer 42 with one or more partial layers made of a metal or a metal compound, and also a dielectric cap layer 43. The uncovered vertical sidewalls of the polysilicon layer 41 are thermally oxidized, sidewall oxides 411 being produced. Sacrificial oxide layers produced in the region of the node sections 101 and bit contact sections 102 are not taken into account in the illustration.

Afterward, silicon oxide is firstly deposited by means of an LPCVD method and a base layer 61 of the first insulator layer 6 is provided in this case.

An implantation 52 is performed in unmasked fashion. In the cell array 91, reinforcement implants 24 are formed on account of the implantation 52 and heat treatment steps effected after that. The depth and also the position of the reinforcement implant 24 relative to the edges of the gate stacks 4 are set by means of the layer thickness of the first partial layer 61.

Figure 3A:
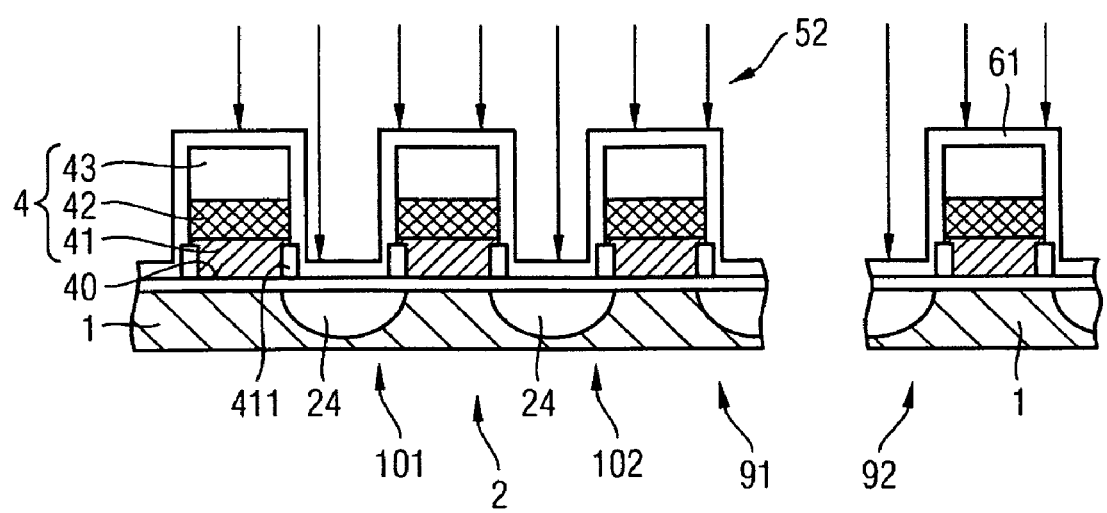
FIGS. 3A-3D illustrate schematic cross-sections of one embodiment of a method according to the invention.
Figure 3B:
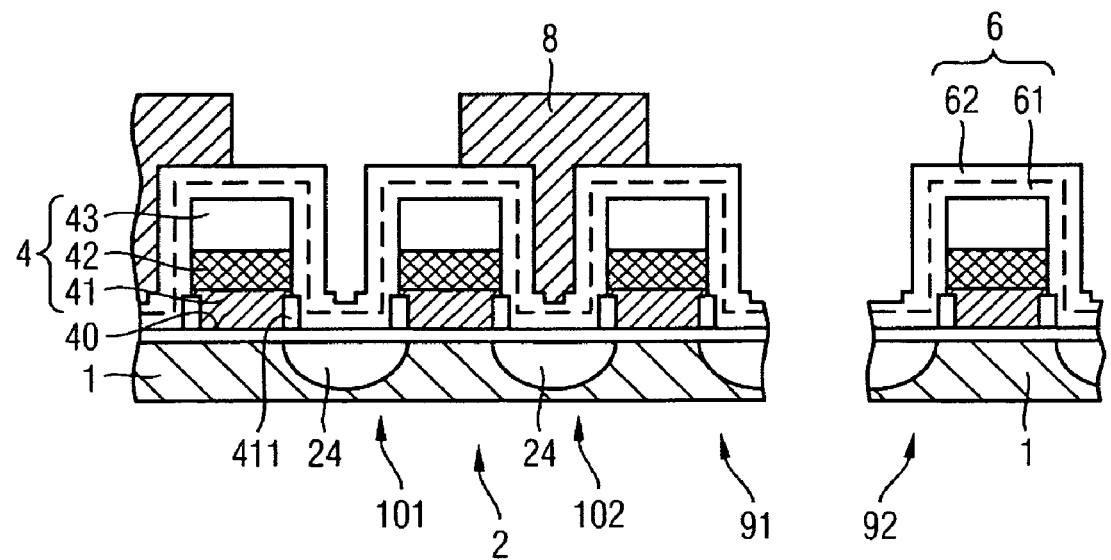

In accordance with FIG. 3B, after the formation of the reinforcement implant 24, a covering layer 62 is applied in order to complete the first insulator layer 6. The bit contact sections 102 are covered by sacrificial structures 8' extending beyond adjoining gate stacks 4. The node sections 101 remain uncovered.

Afterward, a second insulator layer, for instance a silicon nitride layer, is deposited conformally and is caused to recede anisotropically.

Figure 3C:
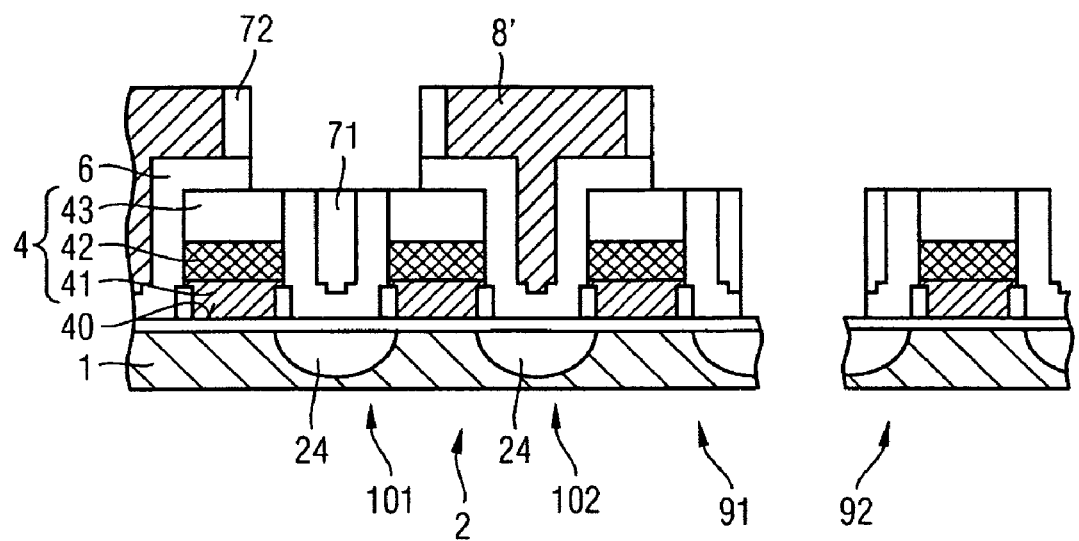

In accordance with FIG. 3C, the second insulator layer gives rise to closure structures 71 between the gate stacks 4 above the node sections 101 and spacer insulators 72 along the vertical sidewalls of the sacrificial structures 8'.

The interspace between the sacrificial structures 8' is subsequently filled with a further dielectric structure 73. The sacrificial structures 8' are removed and the bit contact sections 102 are uncovered in sections by means of an anisotropic spacer etching process that acts on the first insulator layer 6. Spacer structures 6' emerge from the first insulator layer 6. Conductive material is applied and caused to recede into the trenches produced by the removal of the sacrificial structures 8', bit contact structures 8 being formed by the conductive material.

Figure 3D:
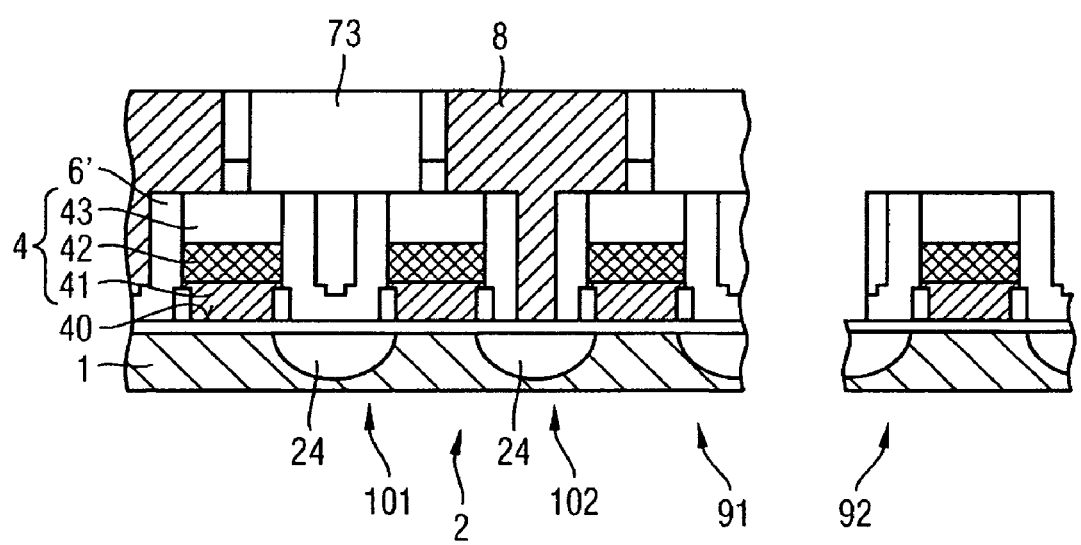

In accordance with FIG. 3D, the sacrificial structures 8' are replaced by bit contact structures 8 which adjoin the semiconductor substrate 1 in the bit contact sections 102 and in each case electrically conductively connect the second source/drain zone 24 partly formed by the reinforcement implant 24 to a data line bearing on the bit contact structure 8. The bit contact structures 8 are insulated from the gate stacks 4 by the spacer structures 6' that have emerged from the first insulator layer 6.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming trench memory cell structures each having a trench capacitor and a selection transistor for selectively addressing the trench capacitor, the method comprising:
    forming trench capacitors, each having a storage electrode formed as filling of a hole trench introduced into a semiconductor substrate from a substrate surface;
    depositing and patterning a gate conductor layer stack on a gate dielectric bearing on the semiconductor substrate to form gate stacks, wherein in the semiconductor substrate in each case a node section and a bit contact section of an active zone of the respective selection transistor is defined and wherein the bit contact section and the node section face each other at the respective gate stack;
    applying a conformal base layer of a first insulator layer to cover a relief formed by the gate stacks;
    forming by implantation doped reinforcement zones at least in the node sections of the semiconductor substrate; and then
    applying a conformal covering layer of the first insulator layer to cover the base layer.

2. The method of claim 1, further including covering the bit contact sections after the application of the covering layer, conformally applying a second insulator layer and filling interspaces between the gate stacks above the node sections by closed structures.

3. The method of claim 2, further comprising:
    applying sacrificial structures for the purpose of covering the bit contact sections, the sacrificial structures extending in sections over sections of the gate stack that are adjacent to the bit contact sections; and
    causing the second insulator layer to recede after application, there being formed from the second insulator layer spacer insulators on uncovered vertical sidewalls of the sacrificial structures and also closure structures that close off the interspaces between the gate stacks above the node sections.

4. The method of claim 3, further including removing the sacrificial structures after the formation of the spacer insulators and opening the first insulator layer above the bit contact section by means of a spacer etching.

5. The method of claim 4, further including applying conductive material after spacer etching and forming bit contact structures adjoining the bit contact sections.

6. The method of claim 1, further including providing the gate conductor layer stack with a first layer made of polysilicon and producing sidewall oxides on the sidewalls of at least the polysilicon layer prior to the application of the base layer.

7. The method of claim 1, further including choosing the thickness of the base layer in a manner dependent on a desired position of the reinforcement zones relative to the gate stacks.

8. The method of claim 1, further including forming the reinforcement zones as a connecting zone between a first source/drain zone of the respective selection transistor and the storage electrode of the respectively assigned trench capacitor of the respective memory cell.

9. The method of claim 1, further including depositing the base layer and the covering layer with the same layer thickness in each case.

10. The method of claim 1, further including providing the first insulator layer as LPCVD silicon oxide.

11. The method of claim 1, further including providing the first insulator layer in more than two layers, and after each layer an implantation step being controlled for the formation of the reinforcement zones.

12. The method of claim 1, further including depositing the layers of the first insulator layer in each case from the same material and under the same process conditions.

13. A method of forming a semiconductor with trench memory cells comprising:
    introducing a hole trench into a semiconductor substrate;
    forming trench capacitors having a storage electrode formed in the hole trench;
    forming a gate dielectric on the semiconductor substrate;
    depositing and patterning a gate conductor layer stack on the gate dielectric to form gate stacks;

forming gate electrodes of selection transistors from the gate stacks;

forming a node section in the semiconductor substrate on one side of a gate electrode of a selection transistor;

forming a bit contact section of an active zone of the respective selection transistor on an opposite side of the gate electrode;

applying a base layer of a first insulating layer on a relief formed by the gate electrodes; then;

forming by implantation doped reinforcement zones at least in the node sections of the semiconductor substrate; and then applying a covering layer of the first insulating layer on the base layer.

14. The method of claim 13, further including covering the bit contact sections after the application of the covering layer, conformally applying a second insulator layer and filling interspaces between the gate stacks above the node sections by closed structures.

15. The method of claim 14, further comprising:

applying sacrificial structures for the purpose of covering the bit contact sections, the sacrificial structures extending in sections over sections of the gate stack that are adjacent to the bit contact sections; and causing the second insulator layer to recede after application, there being formed from the second insulator layer spacer insulators on uncovered vertical sidewalls of the sacrificial structures and also closure structures that close off the interspaces between the gate stacks above the node sections.

16. The method of claim 15, further including removing the sacrificial structures after the formation of the spacer insulators and opening the first insulator layer above the bit contact section by means of a spacer etching.

17. The method of claim 16, further including applying conductive material after spacer etching and forming bit contact structures adjoining the bit contact sections.

18. The method of claim 13, further including providing the gate conductor layer stack with a first layer made of polysilicon and producing sidewall oxides on the sidewalls of at least the polysilicon layer prior to the application of the base layer.

19. The method of claim 13, further including choosing the thickness of the base layer in a manner dependent on a desired position of the reinforcement zones relative to the gate stacks.

20. The method of claim 13, further including forming the reinforcement zones as a connecting zone between a first source/drain zone of the respective selection transistor and the storage electrode of the respectively assigned trench capacitor of the respective memory cell.

* * * * *